US007273821B2

(12) United States Patent
Sezi

(10) Patent No.: US 7,273,821 B2
(45) Date of Patent: Sep. 25, 2007

(54) METHOD FOR PRODUCING A POROUS COATING

(75) Inventor: Recai Sezi, Röttenbach (DE)

(73) Assignee: Infineon Technologies AG, Munich (DE)

( * ) Notice: Subject to any disclaimer, the term of this patent is extended or adjusted under 35 U.S.C. 154(b) by 281 days.

(21) Appl. No.: 10/098,845

(22) Filed: Mar. 14, 2002

(65) Prior Publication Data

US 2002/0132061 A1 Sep. 19, 2002

(30) Foreign Application Priority Data

Mar. 15, 2001 (DE) .................................. 101 12 561

(51) Int. Cl.
*H01L 21/469* (2006.01)
*H01L 21/31* (2006.01)
(52) U.S. Cl. ................ 438/780; 427/534; 257/E21.273
(58) Field of Classification Search ................ 438/758, 438/780, 781
See application file for complete search history.

(56) References Cited

U.S. PATENT DOCUMENTS

| 5,103,288 A | 4/1992 | Sakamoto et al. |
| 5,470,801 A | 11/1995 | Kapoor et al. |
| 5,776,990 A | 7/1998 | Hedrick et al. |

FOREIGN PATENT DOCUMENTS

| EP | 0881678 A2 | 2/1998 |
| JP | 10092804 A | 4/1998 |
| WO | WO 00/43836 | 7/2000 |
| WO | WO 00/64953 | 11/2000 |
| WO | WO 01/104954 A1 | 1/2001 |
| WO | WO 0104954 * | 1/2001 |
| WO | WO 02/071467 A1 | 9/2002 |

OTHER PUBLICATIONS

Falbe, et al., Rompp-Lexikon Chemie, vol. 10, p. 205-206, (1996). (No English Translation Available).
Falbe, et al., Rompp-Lexikon Chemie, p. 3037-3039, (1996). (No English Translation Available).
Falbe, et al., Rompp-Lexikon Chemie, p. 2616-2617, (1996). No English Translation Available).
Falbe, et al., Rompp-Lexikon Chemie, p. 1137, (1996). No English Translation Available).
Falbe, et al., Rompp-Lexikon Chemie, p. 4112, (1996). No English Translation Available).

* cited by examiner

*Primary Examiner*—Alexander Ghyka
(74) *Attorney, Agent, or Firm*—Jenkins, Wilson, Taylor & Hunt, P.A.

(57) ABSTRACT

The present invention relates to a process for producing a porous layer adhering to a substrate, which comprises the steps:
a. preparation of a composition comprising an organic polymer constituent and an inorganic-organic constituent and/or an inorganic constituent,
b. application of this composition to a substrate and formation of a layer on the substrate, and
c. removal of the inorganic-organic constituent and/or the inorganic constituent from the layer to form a porous layer adhering to the substrate.

39 Claims, No Drawings

METHOD FOR PRODUCING A POROUS COATING

The present invention relates to a process for producing porous layers adhering to a substrate and to coated substrates produced by the process, preferably coated substrates which occur in chip technology and in electronic components.

BACKGROUND OF THE INVENTION AND PRIOR ART

The signal propagation time in the metallization planes of integrated circuits (ICs) is of critical importance to the performance of ICs. Particularly in the case of the new generation of chips, this propagation time plays a critical role in the overall speed of the chip, since the length of the metallic conductors is becoming increasingly greater in these chips. To counter the resulting increase in the total resistance of the interconnects, the interconnects used in logic chips are at present made not of aluminum but of copper, since the latter has a lower electrical resistance.

The propagation time is then influenced not by the resistance of the conductor, but by the dielectric constant of the insulator (=dielectric), e.g. between the interconnects. The smaller the dielectric constant, the shorter the propagation time. The coming generation of chips will require, in particular, materials having a dielectric constant of 2.5 or less.

In addition, the materials which are to be used as insulators in chip technology have to meet further strict criteria. These are, for example, high temperature stability (>450° C.) and low moisture absorption (<0.5%) together with very good adhesion to the substrates used in chip technology, for example silicon, silicon oxide, silicon nitride, etc. The abovementioned criteria have hitherto been met by porous organic materials whose matrix is a high-temperature-stable polymer. The "pores" have to have a size ranging from a few nanometers to a few tens of nanometers, since the structure dimension in IC technology has already reached the 100 nm mark.

A critical factor in the production of such porous insulators is the availability of a simple, fast and inexpensive process, i.e. a process which meets manufacturing needs.

According to the prior art (U.S. Pat. No. 5,777,990), a proposed solution is to use copolymers which comprise thermally stable and thermally labile blocks. The decomposition of the labile blocks at elevated temperature ("foaming", usually at above 200° C.) enables pores to be generated, so that the dielectric constant of the material is reduced. By means of the this foaming process, the dielectric constant can be reduced to below 2.5.

The process described in U.S. Pat. No. 5,776,990 for generating pores by thermal decomposition of the labile block has various disadvantages. The thermal decomposition usually forms gaseous fragments which are toxic and/or corrosive and thus pollute or endanger the apparatus and the environment. A further significant problem is that these fragments partially dissolve or swell the stable block and can thus lead to collapse of the structure. In addition, such a decomposition process requires a thermal treatment for a period of up to 10 hours, which does not allow effective and inexpensive production. Furthermore, the stable block is also partially attacked during the decomposition of the labile block at elevated temperature, e.g. by free radicals which are formed in the labile block, as a result of which the stable block looses its thermal and mechanical stability. In addition, the block and graft copolymers described in U.S. Pat. No. 5,776,990 have to be prepared in a new synthesis for each ratio of labile to stable block which is required. In many cases, toxic materials such as phosgene or cresol have to be employed.

WO/0104954 A1 discloses a process for applying a layer to a substrate, in which a polymer composition is applied to a substrate and the solvent used is simultaneously or subsequently removed by the action of heat. Porosity is not described.

EP 881 678 A2 discloses a process for producing integrated circuits, in which silicon dioxide xerogel is applied to a substrate and residual solvent is removed by the action of heat to generate porosity. The xerogel displays poor adhesion to the substrate. In JP 10092804 A (patent Abstracts of Japan), WO 00/43836 A1 and XU,Y. et al.: Dielectric property of a porous polymer material with ultralow dielectric constant, Appl. Phys. Lett., 1999, Vol. 75, No. 6, pp. 853-855, porosity is generated in a layer adhering to a substrate by removal of a solvent from a polymer composition by means of thermal treatment.

WO 00/64953 discloses a process in which the inorganic part is leached from a mixture of organic polymer compounds and inorganic compounds so as to produce an organic polymer containing pores. A process for producing a layer adhering to a substrate is not disclosed.

It is therefore an object of the present invention to provide a process which does not have the abovementioned disadvantages and by means of which porous organic layers can be applied to a substrate in a simple and reproducible manner.

According to the invention, this object is achieved by a process for producing a porous layer adhering to a substrate, which comprises the steps:
a. preparation of a composition comprising an organic polymer constituent and also an inorganic-organic constituent and/or an inorganic constituent,
b. application of this composition to a substrate and formation of a layer on the substrate, and
c. removal of the inorganic-organic constituent and/or the inorganic constituent from the layer to form a porous layer adhering to the substrate.

Further and preferred embodiments are disclosed in the description below and in the claims.

DESCRIPTION

According to the invention, a composition comprising an organic polymer constituent and also an inorganic-organic constituent and/or an inorganic constituent is prepared first. This composition is subsequently applied to a substrate, and a layer is formed on the substrate. The application and formation of the layer can, according to the invention, be carried out by, for example, applying the composition in an organic solvent or a reactive diluent or in the form of a film to the substrate, usually followed by a thermal treatment.

In the applied layer or even in the composition, the inorganic-organic constituent can be chemically bound to the organic polymer constituent, i.e. be present as a copolymer with the organic polymer constituent. In this case, the inorganic-organic constituents are coupled via functional groups to the organic polymer or can, after application to the substrate, be coupled thereto by heat treatment. According to the invention, these functional groups can be, for example, ether, amide or ester groups. Coupling can also occur via double or triple bonds.

The inorganic-organic constituent and/or the inorganic constituent can, according to the invention, also be present as a physical dispersion in the organic polymer constituent, with preference being given, according to the invention, to a very fine and uniform dispersion.

To form a porous layer on a substrate, the inorganic-organic constituent and the inorganic constituent are removed to a substantial extent from the layer formed on the substrate. In the process of the invention, the organic constituent can also be regarded as first constituent and the inorganic-organic and/or inorganic constituent forms a second constituent which is removed to a substantial extent from the layer formed on the substrate so as to form a porous layer on the substrate.

According to the invention, removal of the constituent(s) in question is preferably carried out by bringing the layer applied to the substrate into contact with a suitable solution. This solution must not dissolve or have a swelling action on the organic polymer constituent or attack the polymer in another way but at the same time has to remove the inorganic-organic constituent and/or the inorganic constituent to a substantial extent from the layer.

A further preferred possibility for removing the inorganic and inorganic-organic constituents is plasma treatment of the layer applied to the substrate. This, too, enables the inorganic-organic constituent or the inorganic constituent to be removed from the layer. The temperatures acting on the applied layer during the plasma treatment are significantly below 120° C. Plasmas suitable for the plasma treatment are, in particular, plasmas based on fluorine or chlorine. It is thus possible, according to the invention, not only to use $F_2$ and $Cl_2$ but also to use plasmas such as $CHF_3$, $CF_4$, $CCl_4$, $BCl_3$ and mixtures of these fluorine- or chlorine-containing gases with other gases such as oxygen, oxygen-containing gases such as $CO_2$ or $SO_2$ or with noble gases. The treatment time is preferably from 1 to 10 minutes, more preferably from 2 to 5 minutes. If desired, the coated substrate is subsequently rinsed with an alcohol or amino alcohol.

The solution into which the film is dipped is preferably an aqueous solution. According to the invention, it is possible to use aqueous solutions of inorganic and/or the organic acids. Possible inorganic acids are, in particular, hydrochloric acid (HCL) or hydrofluoric acid (HF) preferably in a concentration of from 5 to 35% by weight, more preferably from 20 to 30% by weight, and also aqueous solutions of sulfuric acid, nitric acid or phosphoric acid, advantageously in dilute form, preferably solutions having a concentration of from 0.1 to 2 molar, more preferably from 0.3 to 1 molar. Particular preference is given to hydrochloric acid and hydrofluoric acid, the latter preferably has a 30% strength by weight solution. According to the invention, suitable organic acids are, in particular, formic acid, acetic acid or oxalic acid, and also fluorinated organic acids such as trifluoroacetic acid or trifluoromethanesulfonic acid. It is in principle possible to use all organic acids which comprise the constituents C, O, H and, if desired, N, F and S and are soluble in or miscible with water, as long as the organic polymer constituent is not partially dissolved or attacked in another way.

Also suitable are solutions which contain a nonmetallic cation and fluoride or chloride as anion, e.g. ammonium fluoride.

According to the invention, it is also possible to use aqueous alkali solutions such as solutions of sodium hydroxide, potassium hydroxide or tetramethylammonium hydroxide. Suitable alkalis are in principle those based on main groups 1 and 2 and also the hydroxides of organic nitrogen compounds, e.g. ammonium hydroxide and tetramethylammonium hydroxide in concentrations of from 0.1 to 2 molar, more preferably from 0.3 to 1 molar.

The aqueous solution can further comprise customary additives, for example alcohol and/or surfactants. Based on the amount (in g) of water, they are, however, present in an amount of not more than 50% by weight according to the invention.

As organic polymer constituents, it is possible to use polymers known per se. The organic polymer constituent comprises the elements carbon, hydrogen and oxygen, and, if desired, nitrogen, sulfur and/or phosphorus. Organic polymer constituents which are preferred according to the invention are polybenzoxazoles (or in the composition which is applied to the substrate, their polyhydroxyamide precursors), polyimide (if desired likewise in the form of a precursor), polyquinoline, polyquinoxaline, polyethers, polybenzimidazoles and/or polyoxadiazoles, and also copolymers or mixtures thereof.

For the purposes of the present invention, inorganic-organic constituents are compounds which comprise an inorganic element and an organic constituent. These include, in particular, organoelement compounds, especially organometallic compounds such as metallocenes and organosilicon compounds, in particular silanes if they have at least one organic radical which preferably comprises 1-10 carbon atoms and, if desired, the elements oxygen, hydrogen, nitrogen and/or sulfur, and siloxanes if they have at least one organic radical which preferably comprises 1-10 carbon atoms and, if desired, the elements oxygen, hydrogen, nitrogen and/or sulfur. Organoelement compounds are organic compounds in which one or more carbon atoms are bound to a different atom, but the classical organic compounds having C—H, C—O, C—N and C-halogen bonds do not fall into this category. Examples of organic radicals for the inorganic-organic constituent are H, alkyl radials, aryl radicals and/or aralkyl radicals which may, if desired, be bound via —O—, —NR—, —S—, —CO— or —COO— groups. These functional groups can be located at any point on the radical, for example in the form of, in particular, —OCH$_2$CH$_3$, —CH$_2$CH$_2$—OH, —OCH$_2$CH$_2$OCH$_3$, —COOCH$_3$, —CH$_2$—Ar—COOCH$_3$, —CH$_2$—Ar—CH$_2$—N (CH$_3$)$_2$, —Ar—CH (NH$_2$) —CH$_3$, where Ar is aryl. They can also appear repeatedly, e.g. in the form of (—OCH$_2$CH$_2$—OCH$_2$CH$_3$). For the purpose of the present invention, aryl is an aromatic, in particular one based on benzene, naphthalene or other fused ring systems or an aromatic containing heteroatoms.

Possible inorganic elements of the inorganic-organic constituent are, according to the invention, in particular, silicon, boron, aluminum, gallium, germanium, tin, titanium, vanadium, chromium, manganese, iron, cobalt, nickel, copper and/or zinc.

According to the invention, in principle compounds of elements of groups 3 to 5 and of transition groups 1 to 8 which are obtainable in inorganic-organic form can be used as inorganic-organic constituent.

In the case of the inorganic-organic constituent being present as copolymer with the organic polymer constituent, the inorganic-organic constituent is coupled via functional groups to the organic polymer constituent. When inorganic-organic constituent and organic polymer constituent are present as copolymers, the inorganic constituent is preferably silicon, iron, cobalt, nickel, copper or zinc. Particular preference is given to silicon. In this case, the inorganic-organic constituents are preferably siloxanes or silanes, each bearing at least one organic radical which is bound via hydroxy, amino or carboxy groups to the organic polymer constituent. Metallocenes are also referred. Examples of particularly preferred inorganic-organic constituents as copolymers are: is(aminopropyl)tetramethyldisiloxane, the zinc complex of 8,13-divinyl-3,7,12,17-tetramethyl-21H, 23H-porphin-2,18-dipropionic acid, 1,1'-diacetylferrocene, complexes of hexadecafluoro-29H,31H-phthalocyanine with iron, cobalt, copper, nickel or zinc and bis(3-carboxy-lpropyl)tetramethyldisiloxane.

When the inorganic-organic constituent and/or the inorganic constituent are present as a dispersion in the organic polymer, preferred inorganic-organic constituents are compounds based on silicon, boron, aluminum, gallium, germanium, tin, titanium, vanadium, chromium, manganese, iron, cobalt, nickel, copper and/or zinc.

According to the invention, inorganic-organic constituents which are particular preferably used as dispersions in the polymer constituent are: 1,1'-diacetylferrocene; 2,6-dibromopyrazabole; dichloro(ethylenebisindenylzirconium); the zinc complex of 8,13-divinyl-3,7,12,17-tetramethyl-21H,23H-porphin-2,18-dipropionic acid, bis(aminopropyl) tetramethyldisiloxane, dodecamethylcyclohexasilane, hexylphenylcyclotrisiloxane, complexes of hexadecafluoro-29H, 31H-phthalocyanine with iron, cobalt, copper, nickel or zinc; potassium(tris-1,2-benzenediolato-O,O'-germanate), lithium limonyl-t-hexylborohydride, complexes of 2,3-naphthalocyanine with cobalt, copper or tin; nickel oxalate; the octabutoxy-29H,31H-phthalo-cyanine-aluminum triethylsiloxide complex.

Inorganic constituents which are preferred according to the invention are silicon, silicon salts, silicon oxide or nitride, silicas or silicates or titanium compounds. Such inorganic materials can also contain organic segments in chemically bound or complexed form. In this case, they count as an inorganic-organic constituent. These segments preferably contain from 1 to at most 10 carbon atoms and also, if desired, oxygen, hydrogen, nitrogen or sulfur. According to the invention, preference is given to: titanium, titanium oxide, boron, aluminum, gallium, germanium, tin, vanadium, chromium, manganese, iron, cobalt, nickel, copper and/or zinc and also oxides and/or salts thereof.

If the inorganic-organic compounds and/or the inorganic constituents are present as a dispersion in the film-forming polymer, preference is given, according to the invention, for these to be present in the form of very fine particles. A very fine dispersion of the material in the organic polymer constituent is preferred. The inorganic-organic constituent and/or the inorganic constituent can, for example, be dispersed in the organic polymer constituent before, together with or after addition of a solvent. The future number and size of the pores can be controlled via the amount and size of the materials dispersed in the organic polymer constituent.

The material dispersed in the polymer constituent has, according to the invention, a molecule or particle size (diameter) of <1000 nm, preferably <100 nm, with particular preference being given to molecule or particle sizes in the range 0.5-50 nm, more preferably 0.5-20 nm.

The material which is physically dispersed in the organic polymer constituent or is present as copolymer is, according to the invention, present in an amount, based on the total weight of organic constituent and inorganic-organic constituent and/or inorganic constituent, of from 10 to 70% by weight, preferably from 20 to 50% by weight, most preferably from 20 to 40% by weight.

When the inorganic-organic constituent is present as a copolymer with the organic constituent, the size of the pores can likewise be controlled via the block size of the participating copolymers. The number of blocks of inorganic-organic constituent and organic constituent enables, according to the invention, the number of the pores to be controlled. Here too, the blocks which are subsequently leached or removed from the layer have, according to the invention, diameters of <1000 nm, preferably <100 nm, more preferably 0.5-50 nm, particularly preferably 0.5-20 nm. The block sizes of the copolymers can be controlled by methods known to those skilled in the art, for example by means of the stoichiometric ratio of the starting monomers used and by the way in which the process is carried out (e.g. order of the reactions).

A particularly fine porous layer is obtained when polybenzoxazole, polyimide or polyether is used as polymer and finely pulverulent silicon dioxide or silica is used as inorganic constituent which is dispersed in the organic constituent. Furthermore, copolymers of polybenzoxazole, polyimide or polyether with siloxanes are particularly useful. Use of such compositions gives particularly advantageous properties of the porous layer, for example very good adhesion to substrates occurring in chip technology, good controllability of the pore size and leachability of the inorganic-organic constituent and/or the inorganic constituent from the applied layer.

The composition can be applied to the substrate in various ways to form a layer on the substrate. For example, the composition can advantageously be taken up in an organic solvent and applied to the substrate.

According to the invention, the solvent can also be replaced by reactive diluents. These are liquid, low molecular weight materials (molar mass up to about 1000) which react with the base polymer on heating. Suitable materials of this type are acrylates, methacrylates, epoxides, styrenes or siloxanes. However, the composition can also be applied in the form of a thin film which is then laminated onto the substrate in a known manner.

The composition dissolved in an organic solvent and/or present in a reactive diluent is applied to a substrate by conventional methods. According to the invention, this can advantageously be carried out by application of the composition to the substrate and subsequent spinning. Other methods such as spraying, dispensing (spreading) or doctor blade coating which are known to those skilled in the art are likewise possible according to the invention.

If the composition is applied in an organic solvent, the coated substrate produced in this way is subsequently dried to remove the solvent and any other volatile constituents. This is preferably carried out at temperatures of from 70 to 140° C., more preferably 90-110° C., for a period of preferably from 1 to 10 minutes, more preferably from 1 to 3 minutes. If desired, drying can be followed by heat treatment (curing) of the applied layer. This is preferably carried out when the organic polymer constituent has up to this point been present only in the form of a precursor which can be converted into the final polymer form by thermal treatment. Examples of such polymers are polyimides and also polybenzoxazoles whose precursors are polyhydroxamides. The heat treatment is usually carried out at a temperature of from 250 to 400° C., preferably from 300 to 350° C., for from 10 to 90 minutes, preferably from 20 to 60 minutes. A heat treatment is also carried out when reactive diluents are used in place of the solvent. In this case, the drying step may be able to be omitted.

As solvents for the composition which is applied to the substrate, preference is given, according to the invention to: N-methylpyrrolidone, γ-butyrolactone, dimethylacetamide, diethylene glycol monoethyl or diethyl ether, ethoxyethyl propionate, methoxypropyl acetate, cyclohexanone, cyclopentanone and mixtures thereof.

According to the invention, the layers applied to the substrate preferably have a dielectric constant of 2.5 or less.

As substrates for the purposes of the invention, preference is given to using materials employed in the chip industry or in electronic components, either as such or in the form of coatings. Particular preference is given to substrates which have a surface composed of silicon, silicon oxide, silicon nitride, silicon oxynitride or silicon carbide. Substrates having surfaces composed of tantalum, tantalum nitride, titanium, titanium nitride, tungsten nitride, tungsten carbide, aluminum, aluminum alloys, e.g. AlSi or AlSiCu, copper, nickel, gold, ceramic or high-temperature-resistant polymers, e.g. epoxy resins or polyimides, are likewise preferred. Further suitable substrates are printed circuit boards, in particular ones based on epoxy resins, polyimides or other high-temperature-resistant polymers.

Furthermore, the invention provides for the use of compositions as described above for coating substrates used in the chip industry, preferably those occurring in flip chips, memory chips, logic chips, flash memories, multichip modules, printed circuit boards, microprocessors or embedded DRAMs.

The present invention also provides electronic components, for example the components mentioned above, which comprise substrates which have been coated by means of the process of the present invention.

It was surprising and was not to have to be expected that simple treatment of the film described with an aqueous solution or a plasma according to the present invention makes it possible to obtain a porous film having a low dielectric constant. In the novel process of the invention, no thermal treatment with its disadvantages as mentioned at the outset is necessary. The porous material remaining on the substrate is neither partially dissolved nor swelled by the treatment with the solution or the plasma and does not collapse. The thermal and mechanical stability of the material applied according to the invention is not adversely affected by the treatment.

The present invention is illustrated below by means of examples which do not, however, restrict the scope of the invention.

EXAMPLES

As organic polymer constituent, the following compound is used in the examples below. This is a bisaminophenol having the following structure:

(9,9'-bis(4-(3-hydroxy-4-aminophenyloxy)phenyl)-fluorene)

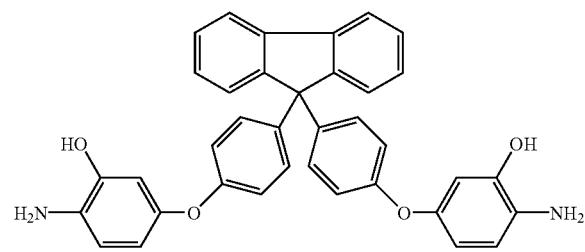

I. Copolymer of Organic Polymer Constituent and Inorganic-Organic Constituent

Example 1

Preparation of a Polybenzoxazole Precursor (Polyhydroxyamide)

56.46 g (0.1 mol) of bisaminophenol are dissolved in 300 ml of distilled N-methylpyrrolidone (NMP). While stirring at 10° C., firstly a solution of 17.2 g (0.05 mol) of 1,3-bis(3-carboxypropyl)tetramethyldisiloxane-dichloride in 75 ml of γ-butyrolactone and then a solution of 10.15 g (0.05 mol) of terephthaloyl dichloride in 75 ml of γ-butyrolactone are added dropwise to the bisaminophenol solution and the reaction solution is stirred for 16 hours. 17.4 g (0.22 mol) of pyridine dissolved in 80 ml of γ-butyrolactone are slowly added dropwise to this solution at room temperature and the reaction solution is stirred for another 2 hours at room temperature. The polybenzoxazole precursor formed (=polyhydroxyamide) is precipitated by introducing the reaction solution dropwise into a mixture of isopropanol and water (1:3), washed three times with fresh precipitate and dried at 50° C./10 mbar in a vacuum drying oven for 72 hours.

The copolymer obtained is a polybenzoxazole precursor in which the siloxane-containing part forms the inorganic-organic block. The remaining monomer units (see above) form the organic block.

Example 2

Preparation of the Formulation and Layer Formation 30 g of the polyhydroxyamide prepared as described in Example 1 are dissolved in 90 g of NMP. For the following experiment, a silicon disc which has been coated with titanium nitride by sputtering is used as substrate. The formulation obtained as described above is applied to the substrate and spun in a spin coater at 2000 rpm for 20 seconds. To dry the layer, the substrate is subsequently laid on a hotplate at 110° C. for 3 minutes. After drying, the layer is heat-treated to convert the polyhydroxyamide into polybenzoxazole. For this purpose, the coated substrate is placed in a regulatable oven and the oven is heated to 330° C. (heating rate: 3° C./min, under nitrogen). After one hour at 330° C., the oven is switched off and the coated substrate is taken out again after cooling.

Example 3

Production of Porous Layers

The coated substrate is, in a fume hood, dipped for 5 minutes into a Teflon dish containing 30% strength hydrofluoric acid. The substrate is then taken out, rinsed a number of times with distilled water, dried and examined under an electron microscope. A porous layer has been formed. The pore size is from about 10 to 30 nm and the thickness of the layer is about 950 nm. Comparison with a layer which has been prepared by a method analogous to Example 2 shows that only the layer which has been treated with hydrofluoric acid possesses pores. The dielectric constant of the layer without pores is 2.7 and of that with pores is 2.3. The dielectric constant was determined by a capacitive method. In this method, the film is present between two titanium layers which have been applied by sputtering. The structure from bottom to top is: silicon/titanium/porous film/titanium. Under the electron microscope, it could be seen that no swelling or detachment of the remaining polymer from the substrate has occurred.

In adhesion tests using a strip of adhesive tape on porous layers produced in this way, very good adhesion (no detachment) was observed.

II. Inorganic-Organic Constituent and/or Inorganic Constituent Dispersed in the Organic Polymer Constituent Example 4

Preparation of a Polybenzoxazole Precursor (Polyhydroxyamide)

56.46 g (0.1 mol) of bisaminophenol 1 are dissolved in 300 ml of distilled N-methylpyrrolidone. While stirring at 10° C., a solution of 20.3 g (0.1 mol) of terephthaloyl dichloride in 150 ml of γ-butyrolactone is added dropwise to the bisaminophenol solution and the reaction solution is stirred for 16 hours. 17.4 g (0.22 mol) of pyridine dissolved in 80 ml of γ-butyrolactone are then slowly added dropwise to this solution at room temperature and the reaction solution is stirred at room temperature for another 2 hours. The polybenzoxazole precursor formed (polyhydroxyamide) is precipitated by introducing the reaction solution dropwise into a mixture of isopropanol and water (1:3), washed three times with fresh precipitate and dried at 50° C./10 mbar in a vacuum drying oven for 72 hours.

Example 5

Preparation of the Formulation and Layer Formation 30 g of the polyhydroxyamide prepared as described in Example 4 are dissolved in 90 g of NMP. 3 g of fine silica are homogeneously mixed into this solution by means of a high-speed stirrer.

For the following experiment, a silicon disc which has been coated with titanium nitride by sputtering is used as substrate. The formulation obtained as described above is applied to the substrate and spun in a spin coater at 1000 rpm for 20 seconds. To dry the layer, the substrate is subsequently laid on a hotplate, firstly at 90° C. for 2 minutes and then at 120° C. for 3 minutes. After drying, the layer is heat-treated to convert the polyhydroxyamide into polybenzoxazole. For this purpose, the coated substrate is placed in a regulatable oven and the oven is heated to 350° C. (heating rate: 3° C./min, under nitrogen). After one hour at 350°, the oven is switched off and the coated substrate is taken out again after cooling.

Example 6

Production of a Porous Layer

The coated substrate is, in a fume hood, dipped for 5 minutes into a Teflon dish containing 30% strength hydrofluoric acid. The substrate is then taken out, rinsed a number of times with distilled water, dried and examined under an electron microscope. A porous layer in which the pores have sizes approximately equal to the particle size of the silica which has been mixed in has been formed. Comparison with a layer which has been prepared by a method analogous to Example 5 shows that only the layer which has been treated with hydrofluoric acid possesses pores. The dielectric constant was 2.45.

Example 7

Preparation of a Formulation and Layer Formation 30 g of a polyhydroxyimide prepared as described in Example 2 of U.S. Pat. No. 4,927,736 (Muller/Khanna; Hoechst; 1990) are dissolved in 90 g of NMP. 5 g of 1,3-bis(3-aminopropyl)tetramethyldisiloxane are homogeneously mixed into this solution by stirring. For the following experiment, a silicon disc which has been coated with titanium nitride by sputtering is used as substrate. The formulation obtained as described above is applied to the substrate and spun in a spin coater at 1000 rpm for 20 seconds. To dry the layer, the substrate is subsequently laid on a hotplate, firstly at 90° C. for 2 minutes and then at 150° C. for 3 minutes.

Example 8

Production of a Porous Layer

The substrate coated as described in Example 7 is, in a fume hood, dipped for 5 minutes into a Teflon dish containing 30% strength hydrofluoric acid. The substrate is then taken out, rinsed a number of times with distilled water, dried and examined under an electron microscope. A porous layer has been formed. Comparison with a layer which has been produced by a method analogous to Example 6 shows that only the layer which has been treated with hydrofluoric acid possesses pores. The dielectric constant of the layer without pores is 2.8 and of that with pores is 2.4.

III. Plasma Treatment

Example 9

Production of a Porous Layer

The film produced as described in Example 2 is etched for 3 minutes in a CF4 plasma in a plasma etching unit (MIE 720 from Materials Research Corp.). This gives a porous film as described in Example 3. The dielectric constant is 2.33.

Example 10

Production of a Porous Layer

The film produced as described in Example 5 is etched for 3.5 minutes in a CF4 plasma in a plasma etching unit (MIE 720 from Materials Research Corp.). This gives a porous film as described in Example 6. The dielectric constant is 2.47.

After plasma treatment, the porous layers once again display very good adhesion to the substrate in the adhesive tape test.

The invention claimed is:

1. A process for producing a porous layer adhering to a substrate, which comprises the steps:
(a) preparing a composition comprising an organic polymer constituent and also an inorganic-organic constituent, wherein the inorganic-organic constituent of the composition is present as a dispersion in the organic polymer constituent, and further wherein the inorganic-organic constituent is one or more of the following compounds: 1,1'-diacetylferrocene; 2,6-dibromopyrazabole; dichloro(ethylenebisindenyl-zirconium); the zinc complex of 8,13-divinyl-3,7,12,17-tetramethyl-21H,23H-porphin-2,18-dipropionic acid, hexylphenylcyclotrisiloxane, complexes of hexadecafluoro-29H,31H-phthalocyanine with iron, cobalt, copper, nickel or zinc; potassium (tris-1,2-benzenediolato-O,O'-germanate), lithium limonyl-t-hexylborohydride, complexes of 2,3-naphthalocyanine with cobalt, copper or tin; nickel oxalate; the octabutoxy-29H,31H-phthalocyanine-aluminum triethylsiloxide complex;
  (b) applying the composition to a substrate;
  (c) forming a layer on the substrate, wherein the layer comprises copolymers of the organic polymer constituent and the inorganic-organic constituent; and
  (d) removing to a desired extent the inorganic-organic constituent from the copolymers in the layer to form a porous layer adhering to the substrate.

2. The process as claimed in claim 1, wherein the organic polymer constituents used in the composition are polyimides, polyquinolines, polyquinoxalines, polyethers, polybenzimidazoles, polyoxadiazoles or copolymers or mixtures thereof.

3. A process for producing a porous layer adhering to a substrate, which comprises the steps:
  (a) preparing a composition comprising an organic polymer constituent and also an inorganic-organic constituent, wherein the inorganic-organic constituent is present as a copolymer with the organic polymer constituent, and further wherein the inorganic-organic constituent comprises at least one of the elements iron, cobalt, nickel, copper and zinc;
  (b) applying the composition to a substrate;
  (c) forming a layer on the substrate, wherein the layer comprises copolymers of the organic polymer constituent and the inorganic-organic constituent; and
  (d) removing to a desired extent the inorganic-organic constituent from the copolymers in the layer to form a porous layer adhering to the substrate.

4. A process for producing a porous layer adhering to a substrate, which comprises the steps:
  (a) preparing a composition comprising an organic polymer constituent and also an inorganic-organic constituent, wherein the inorganic-organic constituent is present as a copolymer with the organic polymer constituent and is one or more of the following compounds: the zinc complex of 8,13-divinyl-3,7,12,17-tetramethyl-21H,23H-porphin-2,18-dipropionic acid, 1,1'-diacetylferrocene, and complexes of hexadecafluoro-29H,31 H-phthalecyanine with iron, cobalt, copper, nickel or zinc;
  (b) applying the composition to a substrate;
  (c) forming a layer on the substrate, wherein the layer comprises copolymers of the organic polymer constituent and the inorganic-organic constituent; and
  (d) removing to a desired extent the inorganic-organic constituent from the copelymers in the layer to form a porous layer adhering to the substrate.

5. The process as claimed in claim 1, wherein the composition comprising the organic polymer constituent and also the inorganic-organic constituent comprises an organic solvent.

6. The process as claimed in claim 5, wherein the step of applying the composition to the substrate is followed by a drying step and, if desired, a heat treatment step.

7. The process as claimed in claim 1, wherein the composition comprising the organic polymer constituent and also the inorganic-organic constituent comprises a reactive diluent.

8. The process as claimed in claim 7, wherein the step of applying the composition to the substrate is followed by a heat treatment step.

9. The process as claimed in claim 1, wherein the composition is applied to the substrate by placing the composition on the substrate and subsequently spinning the substrate.

10. The process as claimed in claim 1, wherein the composition comprising the organic polymer constituent and also the inorganic-organic constituent is applied in the form of a film to the substrate and is subsequently laminated onto the substrate.

11. The process as claimed in claim 6, wherein the composition which has been applied to the substrate is dried at a temperature of 70-140° C. for 1-10 minutes.

12. The process as claimed in claim 8, wherein the heat treatment is carried out at temperatures of 250-400° C. for 10-90 minutes.

13. The process as claimed in claim 1, wherein the removal of the inorganic-organic constituent is carried out by bringing the composition applied to the substrate into contact with a suitable solution or by plasma treatment.

14. The process as claimed in claim 13, wherein the composition applied to the substrate is brought into contact with an aqueous solution of inorganic acids, organic acids, inorganic bases, hydroxides of organic nitrogen compounds and/or compounds comprising a nonmetallic cation and fluoride or chloride as anion.

15. The process as claimed in claim 14, wherein aqueous solutions of hydrochloric acid and/or hydrofluoric acid are used.

16. The process as claimed in claim 15, wherein the aqueous solution further comprises alcohols or surfactants in a total amount, based on the water, of not more than 50% by weight.

17. The process as claimed in claim 13, wherein the plasma treatment is carried out using plasmas based on fluorine or chlorine, $CHF_3$, $CF_4$, $CCl_4$, $BCl_3$ or mixtures of these gases with at least one other gas selected from the group consisting of oxygen, a noble gas or an oxygen-containing gas.

18. The process as claimed in claim 1, wherein the amount of organic polymer constituents, based on the total weight of organic polymer constituent and inorganic-organic constituent and/or inorganic constituent, is from 10 to 70% by weight.

19. The process as claimed in claim 1, wherein the substrate has a surface composed of silicon, silicon oxide, silicon nitride, silicon oxynitride, silicon carbide, tantalum, tantalum nitride, titanium, titanium nitride, tungsten nitride, tungsten carbide, aluminum, an aluminum alloy, copper, nickel, gold, ceramic or a high-temperature-resistant polymer.

20. The process as claimed in claim 1, wherein the porous layer formed on the substrate has a pore size having a diameter of <1000 nm.

21. The process as claimed in claim 1, wherein the dielectric constant of the porous layer is 2.5 or less.

22. The process as claimed in claim 21, wherein the size and number of pores is controlled by varying the number and sizes of the organic polymer constituents and of the inorganic-organic constituents and/or the inorganic constituents.

23. The process as claimed in claim 1, wherein the applied layers have a thickness of from 0.2 to 10 µm.

24. A process for producing a porous layer adhering to a substrate, which comprises the steps:
(a) preparing a composition comprising an organic polymer constituent and also an inorganic-organic constituent and/or an inorganic constituent;
(b) applying the composition to a substrate and formation of a layer on the substrate; and
(c) removing the inorganic-organic constituent and/or the inorganic constituent from the layer to form a porous layer adhering to the substrate,
wherein the organic polymer constituents used in the composition is polyhydroxyamides.

25. A process for producing a porous layer adhering to a substrate, which comprises the steps:
(a) preparing a composition comprising an organic polymer constituent and also an inorganic-organic constituent and/or an inorganic constituent;
(b) applying the composition to a substrate and formation of a layer on the substrate; and
(c) removing the inorganic-organic constituent and/or the inorganic constituent from the layer to form a porous layer adhering to the substrate,
wherein the inorganic-organic constituent is dodecamethylcyclo-hexasilane.

26. A process for producing a porous layer adhering to a substrate, which comprises the steps:
(a) preparing a composition comprising an organic polymer constituent and also an inorganic-organic constituent and/or an inorganic constituent;
(b) applying the composition to a substrate and formation of a layer on the substrate; and
(c) removing the inorganic-organic constituent and/or the inorganic constituent from the layer to form a porous layer adhering to the substrate,
wherein the inorganic-organic constituent present as copolymer with the organic polymer constituent comprises silicon.

27. The process as claimed in claim 5, wherein the organic solvent is selected from the group consisting of N-methylpyrrolidone, γ-butyrolactone, dimethylacetamide, diethylene glycol, monoethyl ether, diethyl ether, ethoxyethyl propionate, methoxypropyl acetate, cyclohexanone, cyclopentanone, or a mixture thereof.

28. The process as claimed in claim 7, wherein the reactive diluent comprises an acrylate, methacrylate, epoxide, styrene, siloxane, or a mixture thereof.

29. The process as claimed in claim 11, wherein the composition which has been applied to the substrate is dried at a temperature of 90-110° C. for 1-3 minutes.

30. The process as claimed in claim 12, wherein the heat treatment is carried out at temperatures of 300-350° C. for 20-60 minutes.

31. The process as claimed in claim 17, wherein the oxygen-containing gas is selected from the group consisting of $CO_2$ and $SO_2$.

32. The process as claimed in claim 18, wherein the amount of organic polymer constituents, based on the total weight of organic polymer constituent and inorganic-organic constituent, is from 20 to 50% by weight.

33. The process as claimed in claim wherein the amount of organic polymer constituents, based on the total weight of organic polymer constituent and inorganic-organic constituent, is from 20 to 40% by weight.

34. A process for producing a porous layer adhering to a substrate, which comprises the steps:
(a) preparing a composition comprising an organic polymer constituent and also an inorganic-organic constituent and/or an inorganic constituent;
(b) applying the composition to a substrate;
(c) forming a layer on the substrate, wherein the layer comprises copolymers of the organic polymer constituent and the inorganic-organic constituent and/or an inorganic constituent, and further wherein the substrate has a surface composed of an aluminum alloy selected from the group consisting of AlSi and AlSiCu; and
(d) removing to a desired extent the inorganic-organic constituent and/or the inorganic constituent from the copolymers in the layer to form a porous layer adhering to the substrate;
wherein the inorganic-organic constituent and/or the inorganic constituent comprises an element of main groups 3 to 5 and/or transition groups 1 to 8 of the Periodic Table.

35. The process as claimed in claim 19, wherein the high-temperature-resistant polymer is selected from the group consisting of an epoxy resin and a polyimide.

36. The process as claimed in claim 20, wherein the porous layer formed on the substrate has a pore size having a diameter of <100 nm.

37. The process as claimed in claim 36, wherein the porous layer formed on the substrate has a pore size having a diameter of 0.5-50 nm.

38. The process as claimed in claim 37, wherein the porous layer formed on the substrate has a pore size having a diameter of 0.5-20 nm.

39. The process as claimed in claim 23, wherein the applied layers have a thickness of from 0.3 to 1.5 µm.

* * * * *